(12) United States Patent
Pfirsch

(10) Patent No.: US 8,264,040 B2
(45) Date of Patent: Sep. 11, 2012

(54) LATERAL POWER TRANSISTOR AND METHOD FOR PRODUCING SAME

(75) Inventor: Frank Pfirsch, Munich (DE)

(73) Assignee: Infineon Technologies Austria AG, Villach (AT)

( * ) Notice: Subject to any disclaimer, the term of this patent is extended or adjusted under 35 U.S.C. 154(b) by 402 days.

(21) Appl. No.: 11/653,089

(22) Filed: Jan. 12, 2007

(65) Prior Publication Data
US 2007/0181943 A1 Aug. 9, 2007

(30) Foreign Application Priority Data
Jan. 14, 2006 (DE) .................... 10 2006 001 922

(51) Int. Cl.
*H01L 29/66* (2006.01)
(52) U.S. Cl. ............ 257/340; 257/343; 257/E29.256
(58) Field of Classification Search .......... 257/340, 257/343
See application file for complete search history.

(56) References Cited

U.S. PATENT DOCUMENTS

| | | | |
|---|---|---|---|
| 4,754,310 A | 6/1988 | Coe | |
| 5,216,275 A | 6/1993 | Chen | |
| 5,378,912 A * | 1/1995 | Pein | 257/335 |
| 5,559,348 A | 9/1996 | Watabe et al. | |
| 6,023,090 A | 2/2000 | Letavic et al. | |
| 6,191,453 B1 * | 2/2001 | Petruzzello et al. | 257/350 |
| 6,468,870 B1 * | 10/2002 | Kao et al. | 438/297 |
| 2002/0072159 A1 * | 6/2002 | Nishibe et al. | 438/179 |
| 2003/0001209 A1 * | 1/2003 | John et al. | 257/350 |
| 2004/0164351 A1 * | 8/2004 | Petruzzello et al. | 257/347 |
| 2007/0023831 A1 * | 2/2007 | Kitagawa et al. | 257/342 |

OTHER PUBLICATIONS

Fujihira, Tatsuhiko et al, Simulated Superior Performances of Semiconductor Superjunction Devices, Proceedings of 1998 International Symposium on Powers Semiconductor Devices & ICs, Kyoto, 1998, p. 423-426.

* cited by examiner

*Primary Examiner* — Phat X Cao
(74) *Attorney, Agent, or Firm* — Maginot, Moore & Beck

(57) ABSTRACT

A power transistor includes a semiconductor layer an electrode layer. The semiconductor layer having a source zone, a drain zone spaced apart from the source zone in a lateral direction, a drift zone adjacent to the drain zone, and a body zone. The body zone is interposed between the drift zone and the source zone. The electrode layer is dielectrically insulated from the semiconductor layer, and includes a gate electrode divided into at least two sections and a field plate. The field plate is arranged at a first height level relative to the semiconductor layer. A first gate electrode section is arranged at least partially at a second height level, which is lower than the first height level relative to the semiconductor layer. A second gate electrode section, which is laterally displaced from the first gate electrode section, is disposed at a first intermediate level arranged between the first and second height levels.

16 Claims, 13 Drawing Sheets

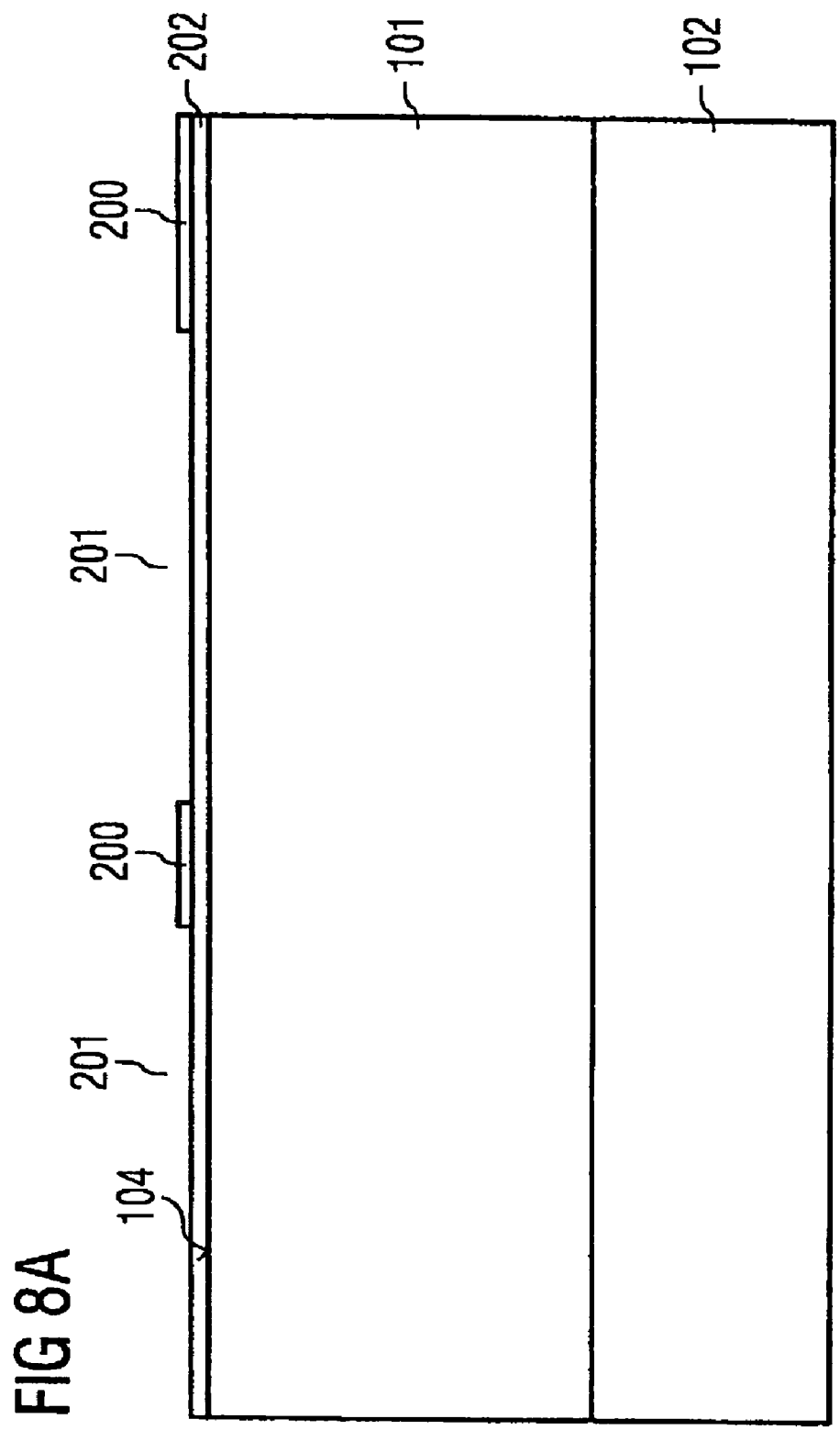

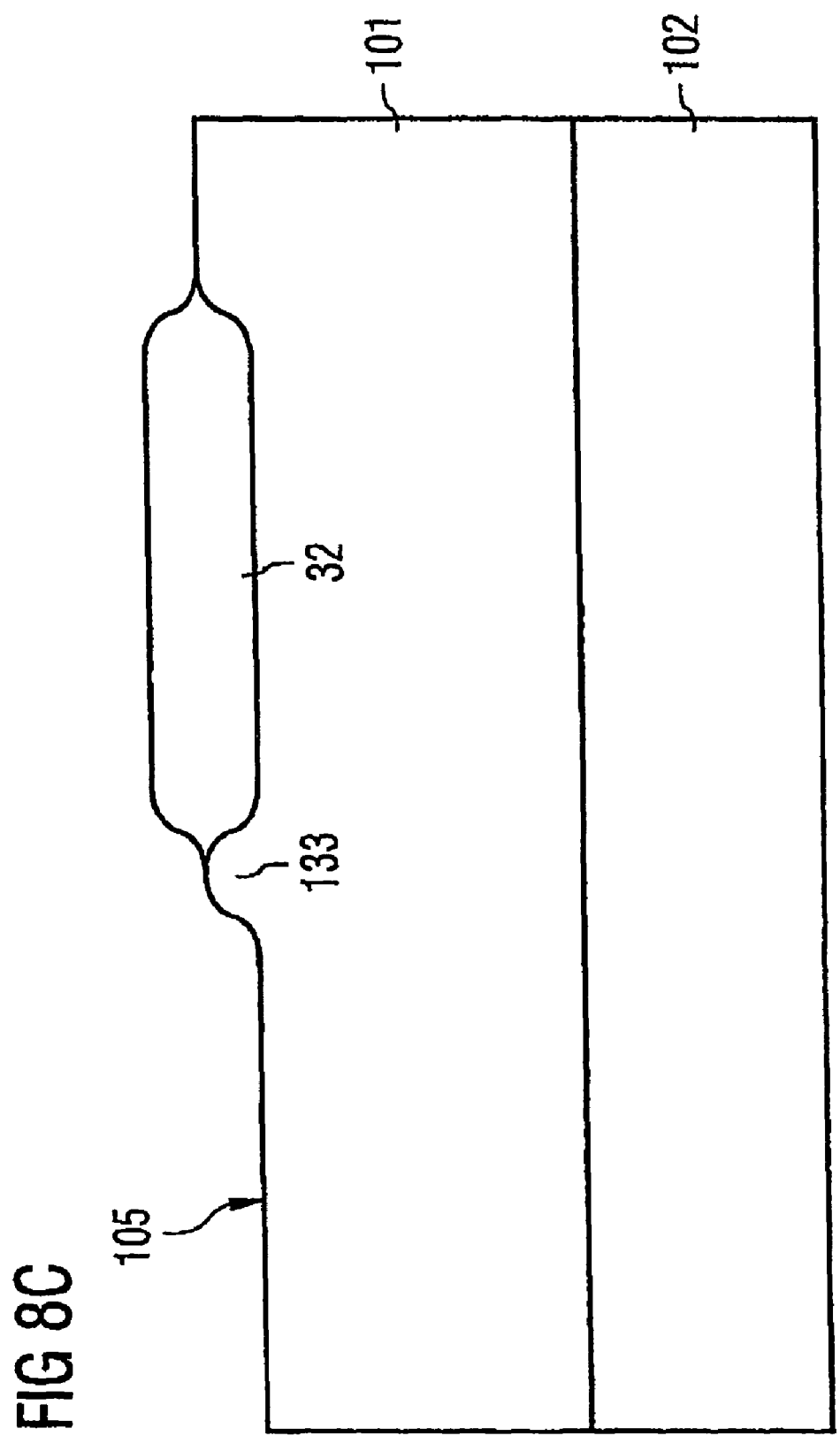

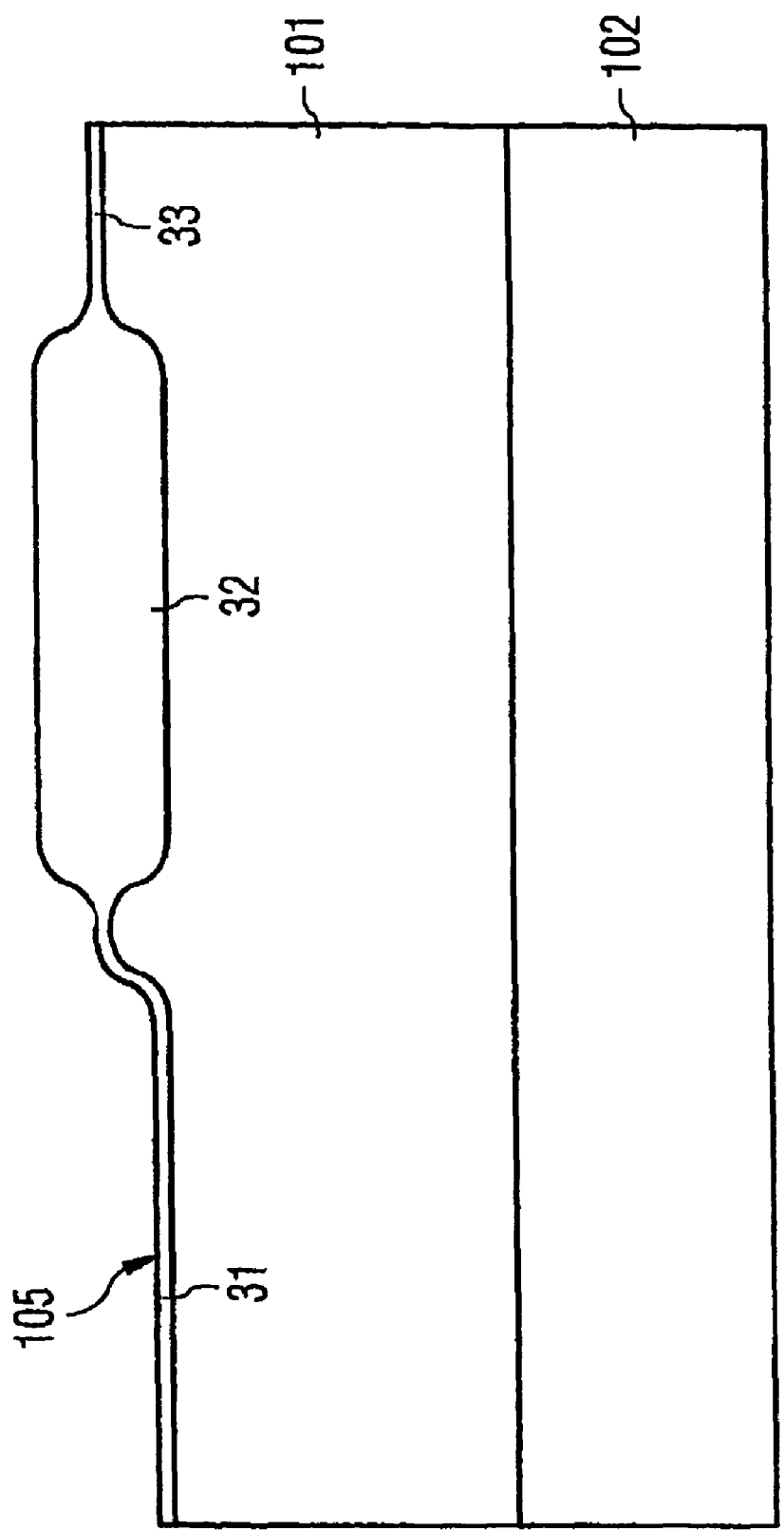

ND METHOD FOR PRODUCING SAME

LATERAL POWER TRANSISTOR AND METHOD FOR PRODUCING SAME

TECHNICAL BACKGROUND

The present invention relates to a lateral power transistor.

For a better understanding of the invention explained below, the basic construction of a lateral power transistor will firstly be explained with reference to FIG. 1. The power transistor has a semiconductor layer 101 of a first conduction type arranged on a substrate 102, which may be a semiconductor substrate or an electrically insulating substrate. Said semiconductor layer 101 comprises a source zone 11 and a drain zone 12 arranged at a distance from one another in a lateral direction of the semiconductor layer 101. A section 13 of the semiconductor layer 101 that is adjacent to the drain zone 12 in the direction of the source zone 11 forms a drift zone of the power transistor. A body zone 14 doped complementarily with respect to the source zone 11 and the drift zone 13 is present between the source zone 11 and said drift zone 13. The source zone 11 and the drain zone 12 are of the same conduction type in the case of a power transistor formed as a MOSFET and are doped complementarily with respect to one another in the case of a power transistor formed as an IGBT.

The source zone 11 is contacted by a source electrode 41, which optionally—via a highly doped connection zone—also contacts the body zone 14, and thereby short-circuits the source zone 11 and the body zone 14. The drain zone 12 is contacted by a drain electrode 42.

In order to control an inversion channel in the body zone 14 between the source zone 11 and the drift zone 13, a gate electrode 21 is present, which is insulated from the semiconductor layer 101 by means of a gate dielectric 31. Said gate electrode 21, at a distance from the body zone 14, undergoes transition to a field plate 22, which is insulated from the semiconductor layer 101 by means of a field plate dielectric 32, which is thicker than the gate dielectric 31.

In this case, the field plate 22 is arranged at a first height level h1 relative to the semiconductor layer 101, while the gate electrode 21 is arranged at a height level h2, which is lower in comparison with the first height level h1, relative to the semiconductor layer 101.

The power transistor turns off if a potential difference between a potential of the gate electrode 21 and the source zone 11 is lower than the so-called threshold voltage of the transistor. With the component in the off state, no inversion channel is formed in the body zone 14 between the source zone 11 and the drift zone 13. With voltage present between the source and drain electrodes 41, 42 or the source zone 11 and the drain zone 12, a space charge zone forms in the drift zone 13 proceeding from the pn junction between the body zone 14 and the drift zone 13. Through the space charge zone there is an increase in the electrical potential in the drift zone 13 (in the case of an n-channel MOSFET or an IGBT) proceeding from the body zone 14. This leads to a voltage stress of the gate dielectric 31, said voltage stress being lowest directly in the region of the pn junction and increasing in the direction of the drain zone 12. In this case, the dielectric strength of said gate dielectric 31 critically influences the dielectric strength of the component. The voltage stress of the gate dielectric 31 can be reduced, in order thereby to increase the dielectric strength of the component, by making that section of the gate electrode which overlaps the drift zone 13 as short as possible. However, a small overlap between the gate electrode 21 and the drift zone increases the on resistance of the component when the latter is in the switched-on state. In other words: a larger overlap between the gate electrode 21 and the drift zone 13 reduces the electrical resistance in the transition region in which charge carriers pass into the drift zone 13 from the accumulation layer in the drift zone 13 below the gate electrode 21.

The voltage stress of the gate dielectric 31 thus increases the more the gate electrode 21 overlaps the drift zone 13 in the direction of the drain zone 12; in this case, voltage spikes or field strength spikes of the electrical occur in particular in the region in which the gate electrode 21 undergoes transition to the field plate 22 or in which the thinner gate dielectric 31 undergoes transition to the thicker field plate dielectric 32.

SUMMARY

A power transistor according to an embodiment of the invention comprises, in a semiconductor layer, a source zone of a first conduction type, a drain zone arranged at a distance from the source zone in a lateral direction of the semiconductor layer, a drift zone of the first conduction type adjacent to the drain zone in the direction of the source zone, and a body zone of a second conduction type complementary to the first conduction type, said body zone being arranged between the drift zone and the source zone.

Additionally, the lateral power transistor has an electrode layer, which is dielectrically insulated from the semiconductor layer and which forms a gate electrode in a first section and a field plate in a second section. The gate electrode is arranged adjacent to the body zone and an accumulation section of the drift zone and is insulated from the semiconductor layer by means of a gate dielectric layer. The field plate is arranged adjacent to a further section of the drift zone and is insulated from the semiconductor layer by means of a field plate dielectric layer, which is thicker than the gate dielectric layer.

The gate electrode has a first gate electrode section and a second gate electrode section arranged between the first gate electrode section and the field plate. In this case, the field plate is arranged at a first height level relative to the semiconductor layer, the first gate electrode section is arranged at least in sections at a second height level, which is lower in comparison with the first height level, relative to the semiconductor layer, and the second gate electrode section is arranged at at least one first intermediate level arranged between the first and second height levels.

The realization of the gate electrode in such a way that the latter, proceeding from the second height level, does not undergo transition directly to the field plate arranged at the first height level, but rather assumes an intermediate level lying between the first and second height levels, the second gate electrode section situated at the intermediate level and being insulated from the semiconductor layer by the gate dielectric—which is thinner than the field plate dielectric—leads to a reduction of the voltage stress of the gate dielectric in the transition region from the gate electrode to the field plate. This has the effect that an overlap region between the gate electrode and the drift zone or the accumulation section of the drift zone can be chosen to be larger than in the case of known lateral power transistors without reducing the dielectric strength of the component. Conversely, this means that given the same overlap between the gate electrode and the drift zone, the component according to the embodiment of the invention has a higher dielectric strength than a comparable known component according.

The lateral power transistor may be realized as a MOSFET or as an IGBT. In the case of a MOSFET, the source zone, the drain zone and the drift zone are of the same conduction type, while the body zone is doped complementarily with respect to these component zones. In the case of an IGBT, the source zone and the drain zone are doped complementarily with respect to one another, the source zone and the drift zone are of the same conduction type and the body zone is doped complementarily with respect to the source zone and the drift zone. Instead of source zone and drain zone, the terms emitter zone and collector zone are also customary in the case of IGBTs. The explanation below exclusively uses the terms source zone, body zone, drift zone and drain zone, but this is not to be understood as restrictive to MOSFET.

BRIEF DESCRIPTION OF THE DRAWINGS

Embodiments of the present invention is explained in more detail below with reference to figures.

DETAILED DESCRIPTION OF THE DRAWINGS

In the figures, unless specified otherwise, identical reference symbols designate identical component regions with the same meaning.

Figure 1:
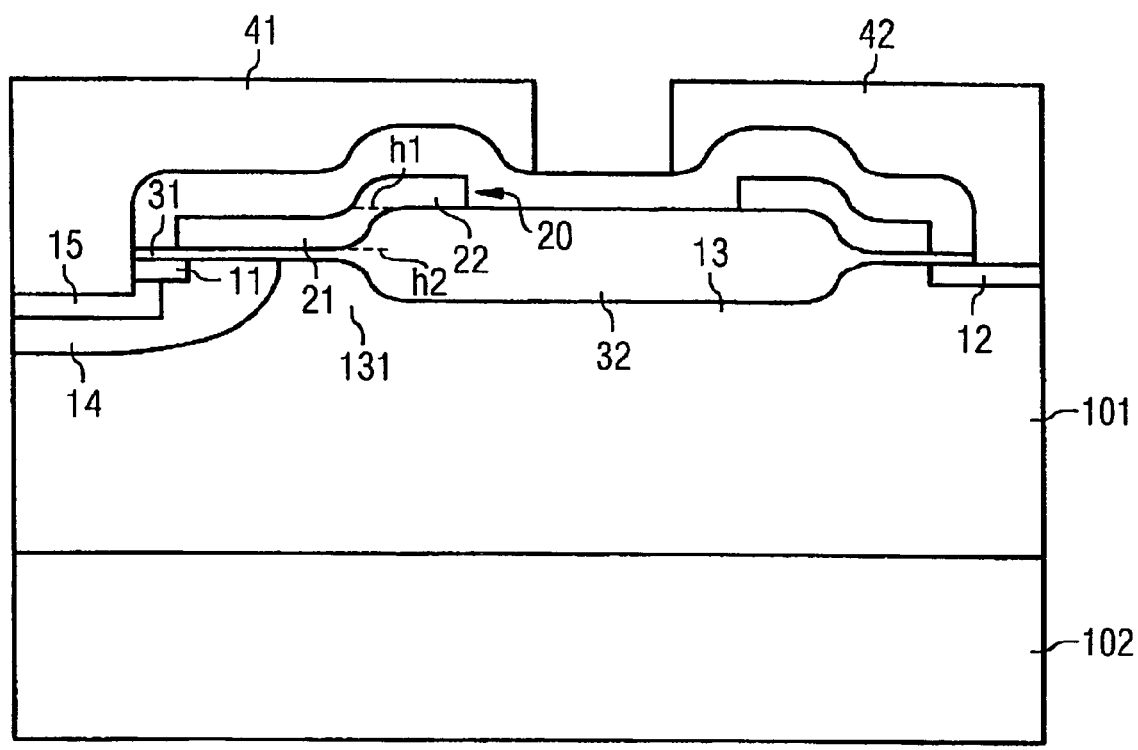
FIG. 1 shows a lateral power transistor in cross section.
Figure 2:
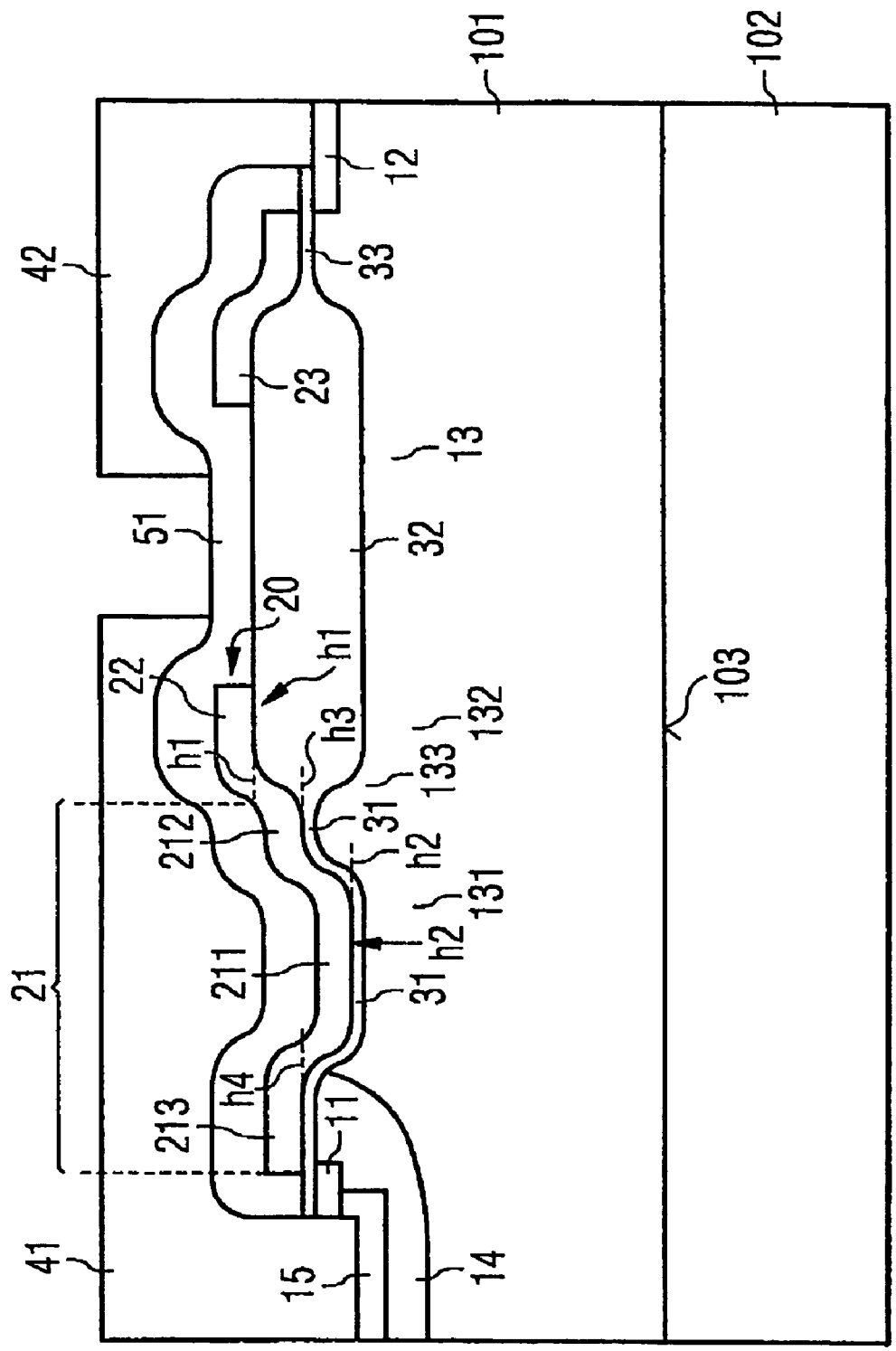
FIG. 2 shows a first embodiment of a lateral power transistor according to the invention in cross section.

FIG. 2 shows a first embodiment of a lateral power transistor according to the invention in side view in cross section. The transistor has a semiconductor layer 101, in which there are arranged a source zone 11 and a drain zone 12 at a distance from the source zone 11 in a lateral direction of the semiconductor layer 101. The drain zone 12 is of the same conduction type as the source zone 11 in the case of a power transistor realized as a MOSFET, and of a conduction type complementary to the conduction type of the source zone 11 in the case of a power transistor realized as an IGBT. A drift zone 13 is adjacent to the drain zone 12 in the direction of the source zone 11, said drift zone being of the same conduction type as the source zone 11. A body zone 14 doped complementarily with respect to the source zone 11 and the drift zone 13 is arranged between the source zone 11 and the drift zone 13.

The semiconductor layer 101 may have a basic doping of the first conduction type, the source zone 11, the body zone 14 and the drain zone 12 being produced by means of suitable doping methods in the semiconductor layer 101. In this case, the drift zone 13 of the lateral power transistor may be a region having the basic doping of the semiconductor layer 101.

The source zone 11 is contacted by a source electrode 41, and the drain zone 12 is contacted by a drain electrode 42. Optionally, the source electrode 41 also contacts the body zone 14 and thereby short-circuits the source 11 and the body zone 14. In FIG. 2 the reference symbol 15 designates a highly doped connection zone 15 within the body zone 14, which is of the same conduction type as the body zone 14 and to which the source electrode 41 is connected.

In order to control an inversion channel in the body zone 14 between the source zone 11 and the drift zone 13, a gate electrode 21 is present, which is dielectrically insulated from the semiconductor layer 101 by means of a gate dielectric 31. The gate dielectric. layer 31 may be an oxide layer and is referred to below as gate oxide. The gate electrode 21 extends in a lateral direction of the semiconductor layer 101 from the source zone 11 over the body zone 14 and over a section 131 of the drift zone 13. The section 131 of the drift zone 13 is referred to below as accumulation section 131 of the drift zone 13. The accumulation section 131 is insulated from the gate electrode 21 by the gate oxide 31. An accumulation layer forms in a region near the surface of the accumulation section 131 when a suitable driving potential is applied to the gate electrode 21.

The power transistor additionally has a field plate 22, which is arranged in a lateral direction between the gate electrode 21 and the drain zone 12 and which is dielectrically insulated from the semiconductor layer 101 by means of a field plate dielectric 32. The field plate dielectric may be an oxide and is referred to below as field oxide. The gate electrode 21 and the field plate 22 are formed by a common electrode layer 20, which is insulated from the source electrode 41 by means of an insulation layer 51. The electrode layer 20 has a first section, which is insulated from the semiconductor layer 101 by the gate oxide 31 and which forms the gate electrode 21, and has a second section, which is insulated from the semiconductor layer 101 by the field oxide 32—which is thicker than the gate oxide 31—and which forms the field plate 22.

The field plate 22 and the gate electrode 21 are arranged at different height levels relative to a fixed reference level of the semiconductor layer 101. It is assumed for the explanation below that said reference level is a lower reference level which lies below the height levels of the field plate 22 and the gate electrode 21 or which corresponds to the bottommost one of said height levels. One height level which satisfies the preconditions is, by way of example, a rear side 103 of the semiconductor layer 101 remote from the gate electrode 21 and the field plate, at which rear side said semiconductor layer adjoins the semiconductor substrate 102 in the example. In addition, when "height level" is used to refer to a "layer", it is referenced herein by the bottom-most surface of that layer. However it will be appreciated that "height level" may also be used to describe the median height level of a layer, or the uppermost level of a layer. In any event, height level comparisons are to be made using a consistent measure of height within the layers for which the height levels are compared.

In the case of this component, the field plate 22 is arranged at a first height level h1 relative to a fixed reference point of the semiconductor layer 101. The gate electrode 21 has a first gate electrode section 211, which is arranged above the accumulation section 131 of the drift zone 13 and which is situated at a second height level h2, which is lower in comparison with the first height level h1, that is to say which is arranged nearer to the fixed reference point of the semiconductor layer 101 in the vertical direction. The gate electrode 21 has a second gate electrode section 212 in a transition region between the gate electrode 21 and the field plate 22, in which second gate electrode section the gate electrode 21 runs at an intermediate level h3 in the lateral direction of the semiconductor layer, said intermediate level lying between the first height level h1 of the field plate 22 and the second height level h2 of the first gate electrode section 211. In this case, the second gate electrode section 212 is likewise dielectrically insulated from the drift zone 13 by the gate oxide 31—which is thinner than the field oxide 32. To summarize, the electrode section 20 has in the lateral direction in the direction of the drain zone 12 a doubly stepped course with a first stepped gradation between the first gate electrode section 211 and the second gate electrode section 212 and a second stepped gradation between the second gate electrode section 212 and the field plate 22. With the component in the off state, that is to say when no inversion channel is formed in the body zone 14 and when a reverse voltage is present between source 11 and drain 12, the transition of the gate electrode 21 to the intermediate level h3 before the transition from the gate electrode 21 to the field plate 22 brings about a reduction of the field strength spikes in the gate oxide 31 in the transition region from the gate oxide 31 to the field oxide 32.

The rises of the electrode layer 20 from the first gate electrode section 211 to the second gate electrode section 212 and from the second gate electrode section 212 to the field plate 22 are preferably as shallow as possible, that is to say that angles formed by said rises with respect to the horizontal are less than 60°, preferably less than 45°.

In the example, a surface of the semiconductor layer 101 has two depressions, a first depression in the region in which the first gate electrode section 211 is arranged, and a second depression in the region in which the field oxide 32 that insulates the field plate 22 from the drift zone 13 is arranged. In the example, the gate electrode 21 has proceeding from the first gate electrode section 211 in the direction of the source zone 11 a further stepped gradation, at which the gate electrode rises proceeding from the second height level h2 to a further intermediate level h4, which corresponds for example to the intermediate level h3 of the second gate electrode section 212. In this case, the third gate electrode section 213 is arranged above the body zone 14.

The component may comprise a further field plate 23, which is arranged at a distance from the field plate 22 in the direction of the drain zone 12 and which is likewise insulated from the drift zone 13 by the field oxide 32. Said field plate 23 may have a stepped gradation in the direction of the field plate 22 and, in a region near the drain zone 12, may be insulated from the drift zone 13 by a dielectric layer 33, which is thinner than the field oxide 32. The thickness of said dielectric layer 33 may correspond to the thickness of the gate oxide 31.

Figure 3:
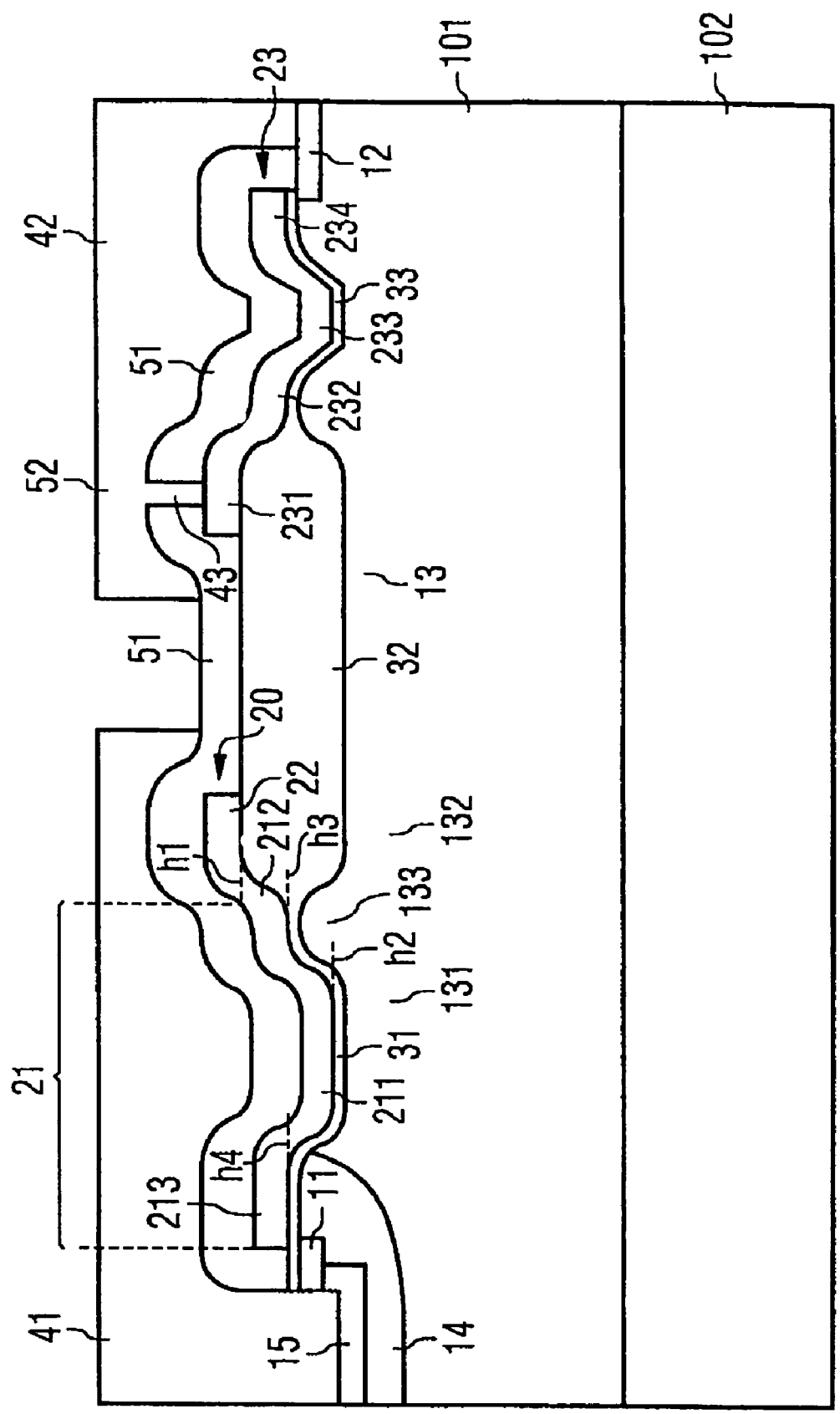
FIG. 3 shows a second embodiment of a lateral power transistor according to the invention in cross section.

FIG. 3 shows an exemplary embodiment of a lateral power transistor according to the invention which differs from that illustrated in FIG. 2 by virtue of the fact that the field plate 23 arranged on the drain side is multiply stepped in a manner corresponding to the electrode layer that is present on the source side and forms the gate electrode 21 and the field plate 22.

Said field plate 23 has a first field plate section 231, which is arranged above the field oxide 32 and thus at the first height level h1. A second field plate section 232 is insulated from the semiconductor layer 101 by a thinner oxide 33, the thickness of which corresponds for example to the thickness of the gate oxide 31, and is arranged at the height of the intermediate level h3 in the example. A third field plate section 233 is arranged at a level which is situated more deeply in relation to the intermediate level h3 and which corresponds to the second height level h2 in the example. The field plate 23 rises again proceeding from the third field plate section 233 in the direction of the drain zone 12 and has, in the region of the drain zone 12, a fourth field plate section 234, which is arranged at the height level h4 of the third gate electrode section 213 in the example.

Figure 4:
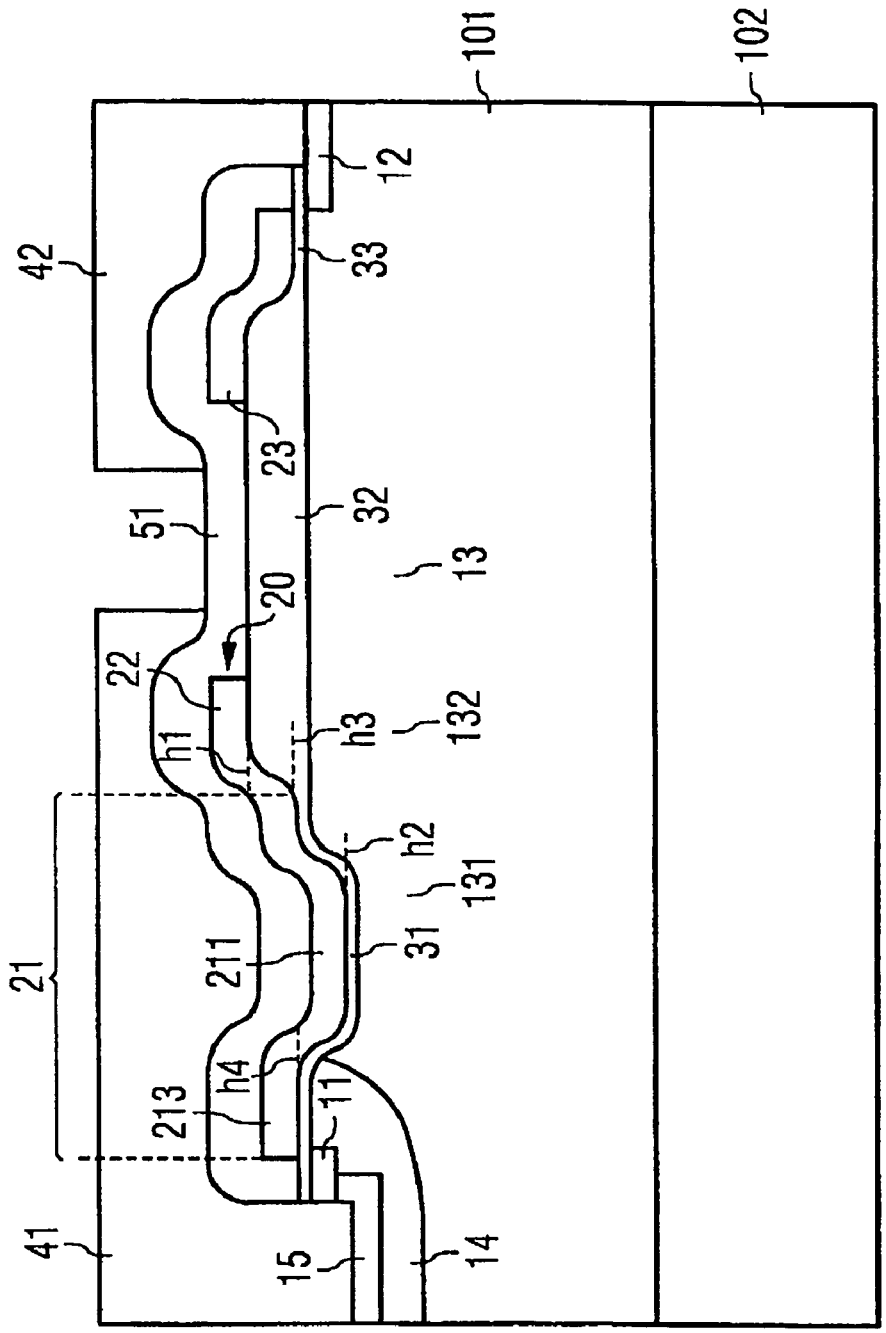
FIG. 4 shows a third embodiment of a lateral power transistor according to the invention in cross section.

FIG. 4 shows a further exemplary embodiment of a lateral power transistor, which differs from that illustrated in FIG. 2 by virtue of the fact that the semiconductor layer 102 in the case of the component in accordance with FIG. 4 has no recess in the region of the field oxide 32. This field oxide 32 in accordance with FIG. 4 may be produced for example by a whole-area production (by means of deposition or thermal oxidation) of an oxide layer and subsequent patterning by masked etching, while the field oxide 32 in accordance with FIG. 2 is produced by a local oxidation of the semiconductor layer 101, for example, in a manner yet to be explained.

Figure 5:
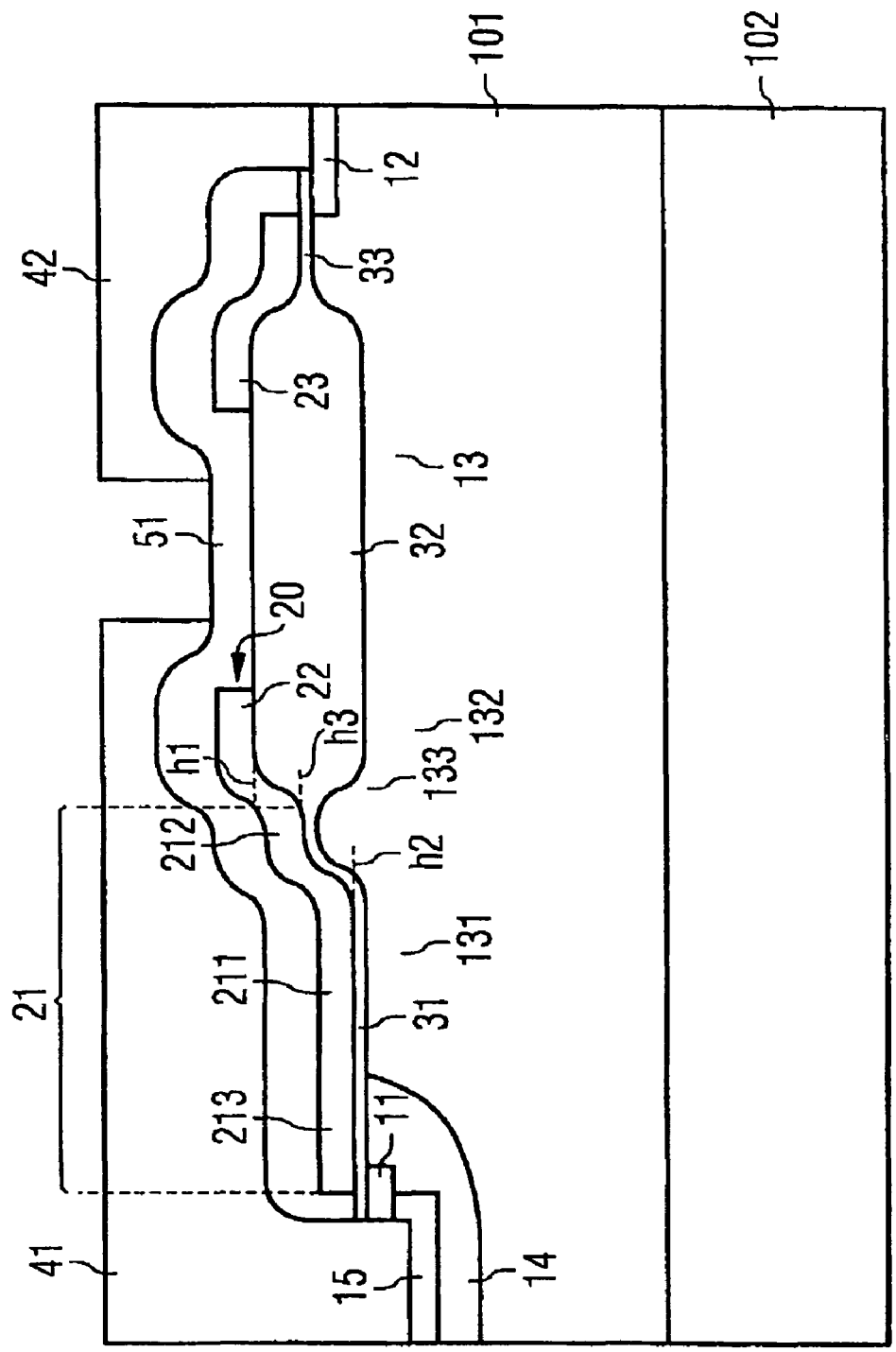
FIG. 5 shows a fourth embodiment of a lateral power transistor according to the invention in cross section.

FIG. 5 shows a further exemplary embodiment of a lateral power transistor having a doubly stepped electrode layer 20 forming a gate electrode 21 and a field plate 22. In the case of this component, the source zone 11 and also the accumulation region 131 of the drift zone 13 are arranged at a common height level. In contrast to the component in accordance with FIG. 2, the gate electrode 21 in the case of this component has no further stepped gradation in the direction of the source zone 11, with the result that the first and third gate electrode sections 211, 213 are likewise situated at the same height level.

The concept explained above, namely of providing an at least doubly stepped electrode layer forming a gate electrode 21 and a field plate 22, can, of course, also be applied to IGBTs. An IGBT can be obtained from the power MOSFET explained above by realizing the drain zone 12 as a semiconductor zone doped complementarily with respect to the drift zone 13.

Figure 6:
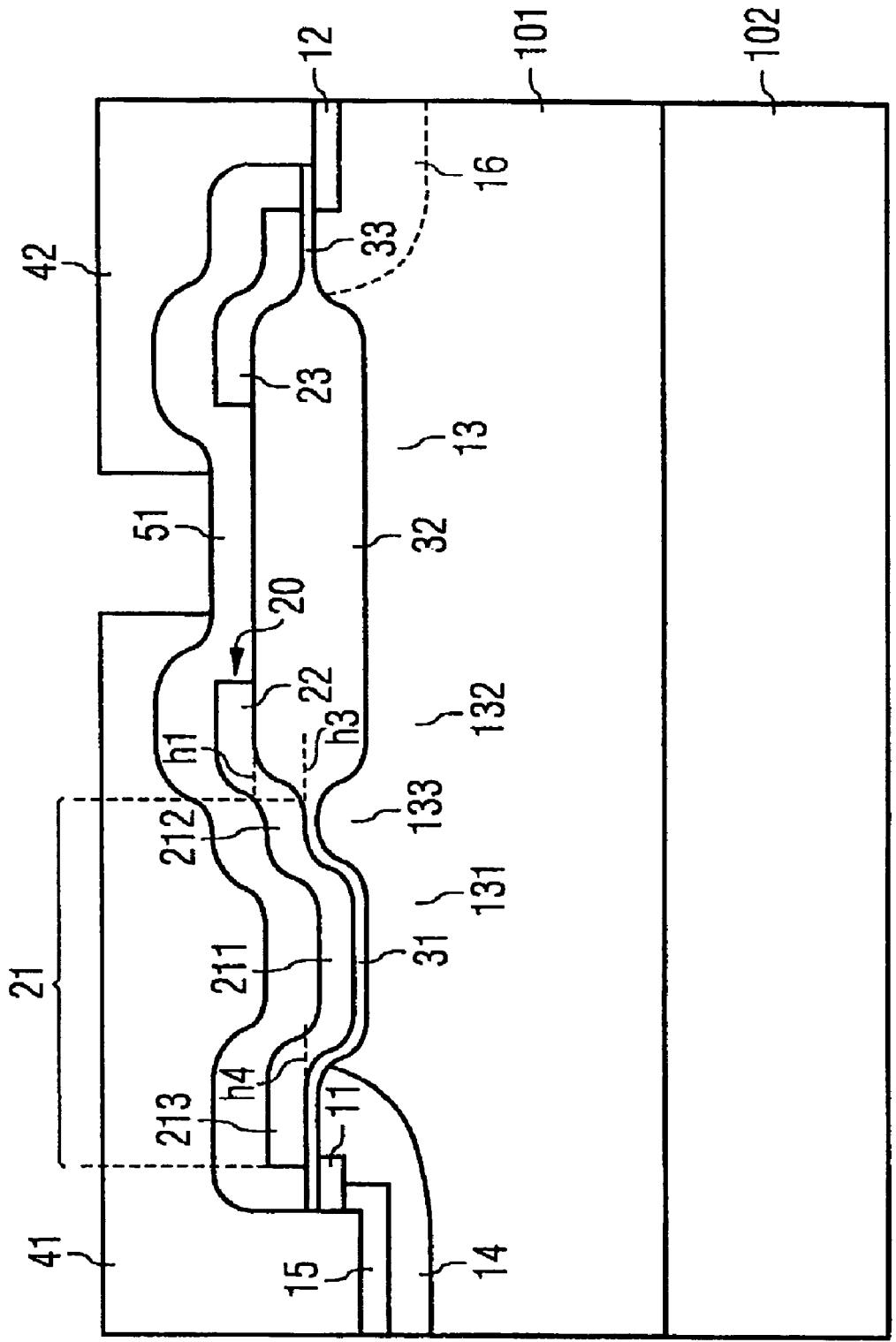
FIG. 6 shows a fifth embodiment of a lateral power transistor according to the invention in cross section.

FIG. 6 shows a lateral power transistor according to the invention which is realized as an IGBT and in which a semiconductor zone 16 that is of the same conduction type as the drift zone 13 but more highly doped is optionally provided between the drain zone 12 doped complementarily with respect to the drift zone 13 and the drift zone 13. The semiconductor zone 16 serves as a buffer zone and prevents a punch-through of the electric field to the drain zone 12 in the off-state case.

In order to realize a power MOSFET that functions according to the compensation principle, it is possible to realize the drift zone in the power MOSFETs explained with reference to FIGS. 2 to 5 such that it has semiconductor zones doped complementarily with respect to one another alternately transversely with respect to the current flow direction.

Figure 7:
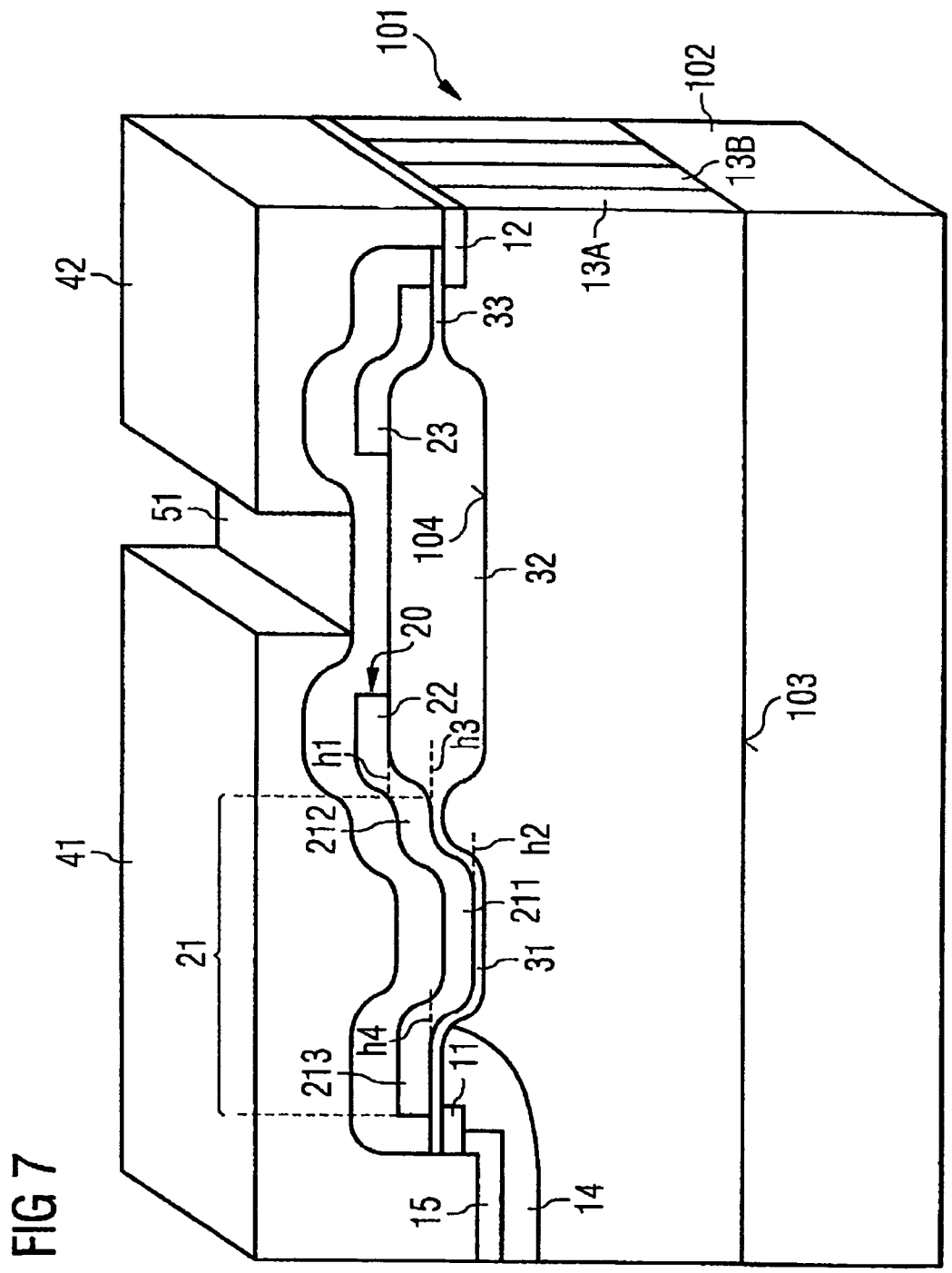
FIG. 7 shows a sixth embodiment of a lateral power transistor according to the invention partially in perspective illustration.

FIG. 7 shows, on the basis of the exemplary embodiment explained with reference to FIG. 2, such a compensation component in which, in the drift zone 13, semiconductor zones 13A, 13B doped complementarily with respect to one another are arranged alternately transversely with respect to the current flow direction, said semiconductor zones in each case extending essentially parallel to the current direction. In this component, the current flow direction is the direction between the source and drain zones 11, 12. Said semiconductor zones 13A, 13B doped complementarily with respect to one another may reach as far as the semiconductor substrate 102, and thus as far as the rear side 103 of the semiconductor layer 101, in one direction and as far as the front side 104 of the semiconductor layer 101 in the opposite direction.

A possible method for producing the lateral power transistor explained above is explained below with reference to FIGS. 8A to 8F. These figures show the transistor in each case in side view in cross section during or after various method steps for producing the component.

FIG. 8A shows the semiconductor layer 101 applied to the semiconductor substrate 102 after first method steps in which an oxide layer 202 is produced over the whole area on a front side 104 of the semiconductor layer 101 and an oxidation protective layer 200 is produced in masked fashion on the oxide layer 202. Said oxidation protective layer 200 is a nitride layer, for example, and is patterned in such a way that it has cutouts 201 in which an oxidation of the semiconductor layer 101 is to be effected in method steps yet to be explained. The oxide layer 202 is optionally present and serves for avoiding or at least reducing a mechanical stress of the semiconductor layer 101 upon application of the oxidation protective 200.

Figure 8B:
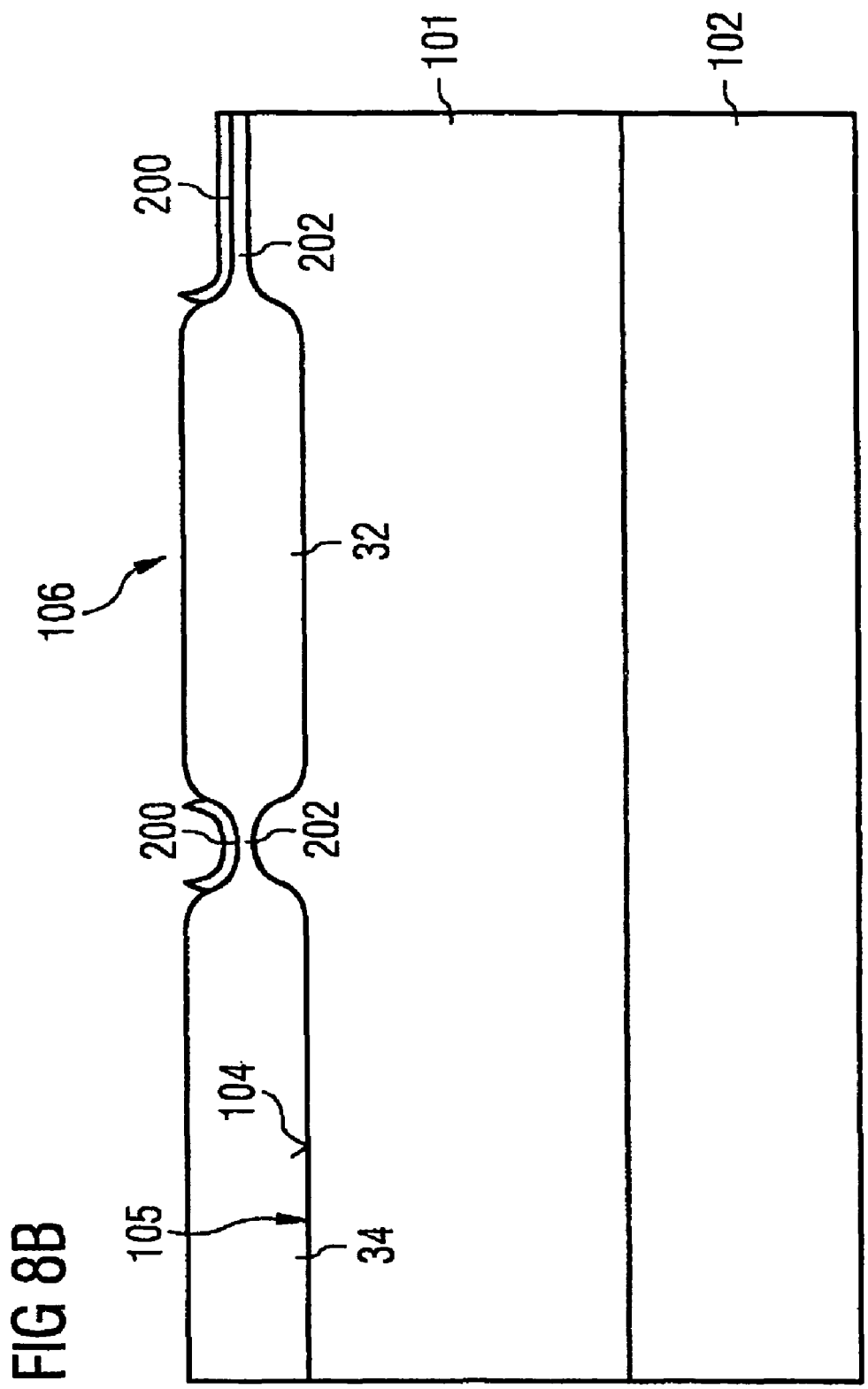
FIG. 8 illustrates a method for producing the lateral power transistor in accordance with FIG. 5.

FIG. 8B shows the semiconductor layer 101 in cross section after carrying out an oxidation step in which at least the front side 104 of the semiconductor layer 101 is heated in an oxidizing atmosphere to an oxidation temperature. The consequence of this oxidation step is that the semiconductor layer 101 is locally oxidized in the regions left free by the oxidation protective layer 200, as a result of which oxide layers 32, 34 grow in said regions. Semiconductor material of the semiconductor layer 101 is "consumed" for the formation of said oxide layers 32, 34, with the result that the semiconductor layer 101 that remains after the oxidation has "depressions" 105, 106 in the regions in which oxide layers 32, 34 form.

The method of local oxidation of the semiconductor layer 101 explained above is known in principle and is referred to as the LOCOS process (LOCOS=Local Oxidation of Silicon). The oxide layers 32, 34 produced by means of this method are comparatively thick and are suitable as field oxide layers, as will be explained below.

In the present method, two of such oxide layers 32, 34 are produced which are arranged at a distance from one another in the current flow direction of the latter component. A first one 32 of said oxide layers serves as the later field oxide layer of the component. A second one 34 of said two oxide layers is situated at the position of the semiconductor layer 101 which forms the later accumulation region (131 in FIGS. 2 to 5) of the drift zone (13 in FIGS. 2 to 5) of the component.

FIG. 8c shows the semiconductor layer 101 after carrying out further method steps in which the thin oxide layer 202 applied at the beginning of the method and also the oxidation protective layer 200 are removed. Furthermore, the second oxide layer 34 is also removed during these method steps. The second oxide layer 34 is removed by means of an etch, for example, during which the first oxide layer 32 is protected against the etching attack by means of a suitable protective layer.

There remain as a result after these method steps the first oxide layer 32 serving as the field oxide layer and, in the region in which the second oxide layer 34 was situated, the depression 105 in the front side 104 of the semiconductor layer 101. Between said depression 105 and the field oxide 32, the front side 101 has a "bulge" 133, which is required for producing the stepped gate electrode (21 in FIGS. 2 to 5).

FIG. 8D shows the semiconductor layer 101 after further method steps in which an oxide layer 31, 33 is produced on uncovered regions of the front side 104 of semiconductor layer 101. Said oxide layer 31 serves as the gate oxide layer 31 in the region of the depression 105 of the semiconductor layer 101.

Figure 8E:
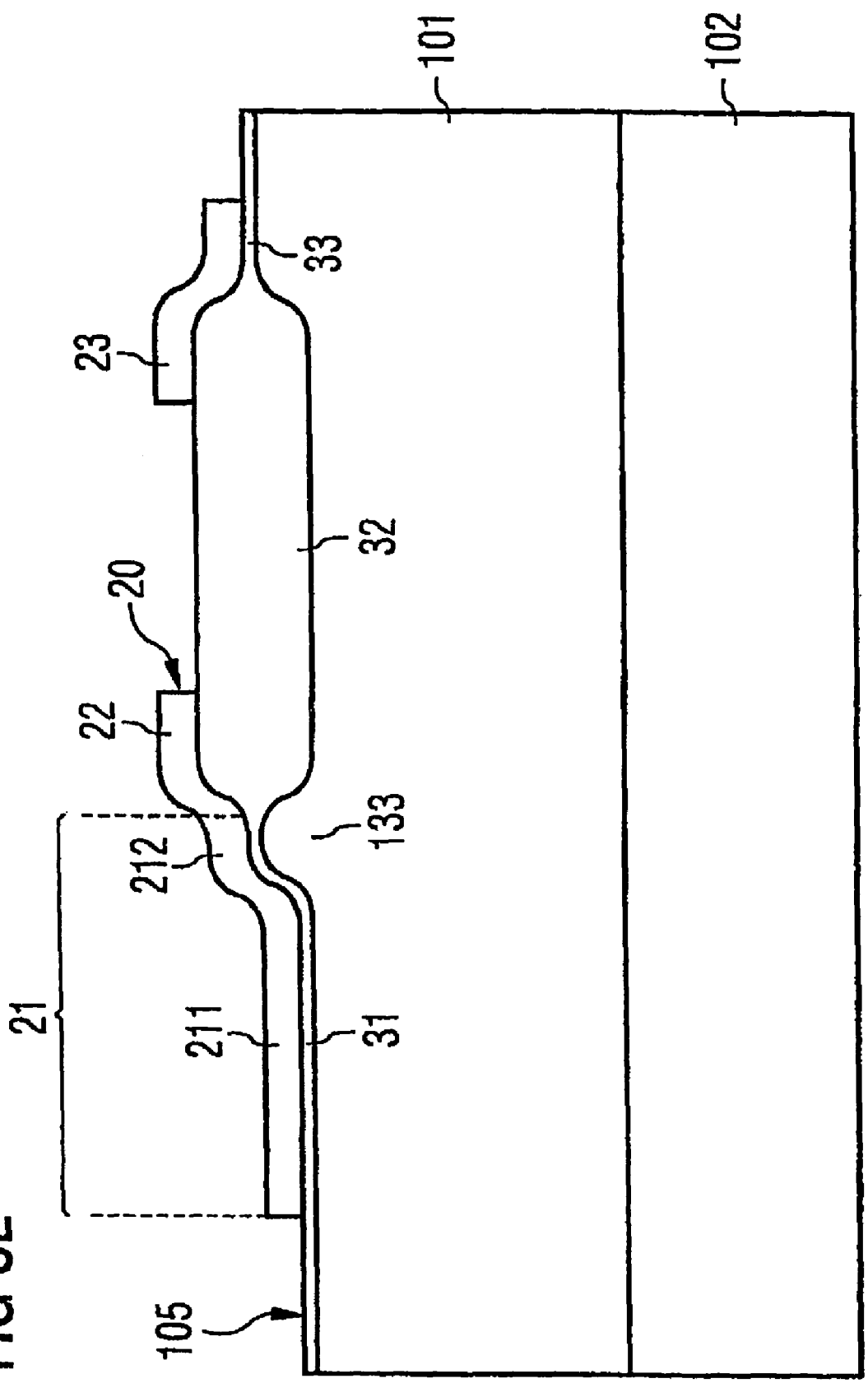

During further method steps, the result of which is illustrated in FIG. 8E, an electrode layer, for example made of highly doped polysilicon, is deposited on the arrangement illustrated in FIG. 8D and is subsequently patterned. Said electrode layer is patterned using a conventional patterning method in which regions of the electrode layer are selectively removed. This is done by applying a protective layer to those regions of the electrode layer which are not intended to be removed, and by removing those regions of the electrode layer which are to be removed using a suitable etchant.

The previously deposited electrode layer is patterned in such a way that an electrode layer section 20 remains above the cutout 105 of the semiconductor layer 101, above the bulge 133 and in sections above the field oxide 32. Said section 20 of the electrode layer forms the gate electrode 21 with two gate electrode sections 211, 212 arranged at different height levels, and also the field electrode 22. A further section of the electrode layer, which is arranged at a distance in the lateral direction from the electrode layer 20 forming the gate electrode 21 and the field plate 22 and in the transition region from the field oxide 32 to the thinner oxide 33, forms the later drain-side field plate 23 of the power transistor.

Figure 8F:
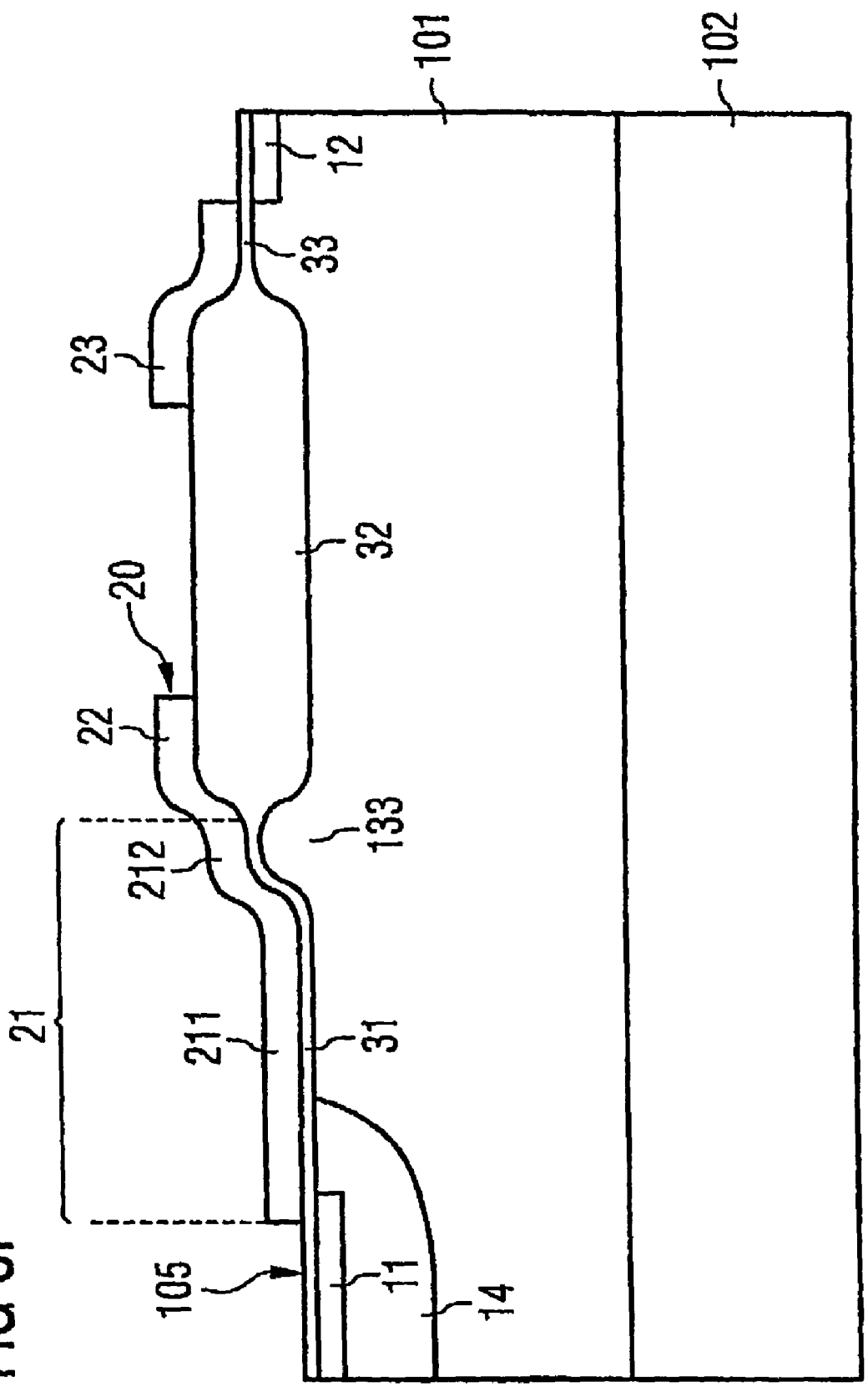

FIG. 8F shows the semiconductor layer 101 after further method steps in which the source zone 11, the body zone 14 and the drain zone 12 are produced. The production of these doped semiconductor zones within the semiconductor layer 101 is effected by means of sufficiently known implantation and/or diffusion steps. In this case, the body zone 14 and the source zone 11 may be produced using the gate electrode 21 as a mask. In order to produce the body zone 14, in this case dopants are implanted into the semiconductor layer 101 via the front side 104 and subsequently indiffused further into the semiconductor layer 101 by means of a diffusion step, which bring about a zone doped complementarily with respect to the basic doping of the semiconductor layer 101. On account of the diffusion step, a diffusion under the gate electrode 21 occurs in the lateral direction. The source zone 11 is produced correspondingly using dopants which bring about a source zone 11 doped complementarily with respect to the body zone 14. In this case, however, the diffusion step is effected at lower temperatures and/or with a shorter diffusion duration, with the result that less diffusion under the gate electrode 21 takes place than during the production of the body zone 14. A lesser degree of underdiffusion of the source zone 11 in comparison with the body zone 14 may equally be achieved by choosing a dopant having a smaller diffusion constant for the source zone 11 than for the body zone 14.

The production of the drain zone 12 may be effected in a manner corresponding to the production of the source zone 11 using the field plate 23 as a mask.

These method steps explained with reference to FIG. 8 are followed by further method steps (not specifically illustrated) for producing the source and drain electrodes 41, 42 illustrated in FIG. 5. Said electrodes may be produced for example by deposition of an electrode layer and subsequent patterning of said electrode layer.

The method for producing a lateral power transistor according to the invention has been explained with reference to FIG. 8 for the production of the power transistor in accordance with FIG. 5. In this component, the first and third gate electrode sections 211, 213 are situated at a common height level, which is achieved by virtue of the fact that the front side 104 of the semiconductor layer 101 does not have a further stepped gradation in this region of the gate electrode. Such a component can be produced, referring to FIG. 8, by means of the cutout 105 that arises through the oxide layer 34 being large enough to realize the source and body zones 11, 14 and the accumulation zone 131 at least in sections below said cutout.

A component in accordance with FIG. 2, in which the gate electrode 21 has a further stepped gradation in the direction of the source zone 11, can be produced by means of the method explained above by virtue of the second oxide 34 having smaller dimensions in the lateral direction, so that, during the method steps explained with reference to FIG. 8F for producing the source zone 11, the source zone 11 is produced in such a region of the semiconductor layer 101 which lies alongside the cutout 105 produced by the production of the second oxide 34.

The production of a component in accordance with FIG. 3, in which the drain-side field plate is also multiply stepped, can be achieved by means of the method explained above by virtue of a further thick oxide layer being produced at a distance from the oxide layer forming the field oxide 32 in the direction of the later drain zone, said further thick oxide layer being removed together with the second oxide layer 34. The production of said further oxide layer leads, in the drain-side region of the component, to a further depression in the semiconductor layer 101, in which the drain-side field plate is produced during the method steps explained with reference to FIG. 8E.

An IGBT is realized by producing, instead of an implantation of dopant atoms of the same conduction type as the basic doping of the semiconductor layer 101, a semiconductor zone doped complementarily with respect to said basic doping.

A component in accordance with FIG. 4, in which the semiconductor layer 101 has no depression in the region of the field oxide 32, is realized by virtue of the fact that during the LOCOS process, firstly only the thick oxide layer (34 in FIG. 8B) that is removed again later is produced, while the semiconductor layer in the region of the later field oxide 32 is firstly protected against an oxidation. Afterward, an oxide layer is deposited locally in the region in which the field oxide 32 is to be produced. Such an oxide layer may be a TEOS layer (TEOS=tetraethoxysilane), for example, which can be deposited locally using a mask having a cutout. As an alternative, it is also possible first to produce the field oxide 32 by whole-area production, for example by means of deposition or thermal oxidation, of an oxide layer and subsequent patterning by masked etching, while the second oxide layer 34 is produced, as described, by local oxidation of the semiconductor layer 101 and subsequently removed again.

A compensation component in accordance with FIG. 7 can be realized using the method steps explained with reference to FIG. 8 by virtue of the semiconductor layer 101 already having a number of semiconductor layers that are arranged adjacent to one another and doped complementarily with respect to one another before said method steps are carried out.

The invention claimed is:

1. A lateral power transistor comprising:
a semiconductor layer, in the semiconductor layer:
a source zone of a first conduction type,
a drain zone arranged at a distance from the source zone in a lateral direction of the semiconductor layer,
a drift zone adjacent to the drain zone in the direction of the source zone, and
a body zone of a second conduction type complementary to the first conduction type, said body zone being arranged between the drift zone and the source zone,
an electrode layer, which is dielectrically insulated from the semiconductor layer and which forms a gate electrode in a first section and a field plate in a second section,
wherein the gate electrode is arranged adjacent to the body zone and an accumulation section of the drift zone and is insulated from the semiconductor layer by means of a gate dielectric layer, and
wherein the field plate is arranged adjacent to a further section of the drift zone and is insulated from the semiconductor layer by means of a field plate dielectric layer, which is thicker than the gate dielectric layer,
wherein the gate electrode has a first gate electrode section and a second gate electrode section, the second gate electrode section being arranged between the first gate electrode section and the field plate, and wherein
the field plate has an outer surface arranged at a first height level relative to a reference level in the semiconductor layer,
the first gate electrode section has an outer surface arranged at least in sections at a second height level, which is closer to the reference level in comparison with the first height level, and
the second gate electrode section has an outer surface extending in the lateral direction that is arranged at at least one first intermediate level arranged between the first and second height levels relative to the reference level;
wherein the first and the second gate electrode sections are each insulated from the semiconductor layer by the gate dielectric layer that is thinner than the field plate dielectric layer such that the gate dielectric layer has a substantially uniform thickness for both the first and the second gate electrode sections; and
wherein the first height level, the second height level and the first intermediate level are defined by that side of the gate dielectric layer facing away from the semiconductor layer.

2. The power transistor as claimed in claim 1, which is realized as a MOSFET and in which the drain zone is of the same conduction type as the drift zone but more heavily doped.

3. The power transistor as claimed in claim 1, which is realized as an IGBT and in which the drain zone is of a complementary conduction type with respect to the drift zone.

4. The power transistor as claimed in claim 1, in which the drift zone is of the first conduction type.

5. The power transistor as claimed in claim 1, wherein which the drift zone is a semiconductor zone of the first conduction type.

6. The power transistor as claimed in claim 1, wherein the drift zone has in a direction perpendicular to a direction running between the source zone and the drain zone alternately a number of semiconductor zones that are respectively doped complementarily to one another.

7. The lateral power transistor as claimed in claim 1, wherein all dielectric portions disposed between the first and the second gate electrode sections and the semiconductor layer has a substantially uniform thickness for both the first and the second gate electrode sections.

8. The lateral power transistor as claimed in claim 1, wherein the gate electrode extends past an end of the body zone.

9. A lateral power transistor comprising:
a semiconductor layer, in the semiconductor layer:
a source zone of a first conduction type,
a drain zone arranged at a distance from the source zone in a lateral direction of the semiconductor layer,
a drift zone adjacent to the drain zone in the direction of the source zone, and
a body zone of a second conduction type complementary to the first conduction type, said body zone being arranged between the drift zone and the source zone,
an electrode layer, which is dielectrically insulated from the semiconductor layer and which forms a gate electrode in a first section and a field plate in a second section,
wherein the gate electrode is arranged adjacent to the body zone and an accumulation section of the drift zone and is insulated from the semiconductor layer by means of a gate dielectric layer, and wherein the field plate is arranged adjacent to a further section of the drift zone and is insulated from the semiconductor layer by means of a field plate dielectric layer, which is thicker than the gate dielectric layer, wherein the gate electrode has a first gate electrode section and a second gate electrode section, the second gate electrode section being arranged between the first gate electrode section and the field plate, and wherein
- the field plate has an outer surface arranged at a first height level relative to a reference level in the semiconductor layer,
- the first gate electrode section has an outer surface arranged at least in sections at a second height level, which is closer to the reference level in comparison with the first height level, and
- the second gate electrode section has an outer surface extending in the lateral direction that is arranged at at least one first intermediate level arranged between the first and second height levels relative to the reference level;

wherein the first and the second gate electrode sections are each insulated from the semiconductor layer by the gate dielectric layer that is thinner than the field plate dielectric layer such that the gate dielectric layer has a substantially uniform thickness for both the first and the second gate electrode sections;

wherein the first height level, the second height level and the first intermediate level are defined by that side of the gate dielectric layer facing away from the semiconductor layer; and wherein the gate electrode has a third gate electrode section, which is arranged adjacent to the body zone and which is arranged at a second intermediate level.

10. The power transistor as claimed in claim 9, in which the second intermediate level corresponds to the first intermediate level.

11. A power transistor comprising:
- a semiconductor layer having a source zone of a first conduction type,
- a drain zone spaced apart from the source zone in a lateral direction,
- a drift zone adjacent to the drain zone in the direction of the source zone, and
- a body zone of a second conduction type complementary to the first conduction type, said body zone interposed between the drift zone and the source zone,
- an electrode layer dielectrically insulated from the semiconductor layer, the electrode layer including a gate electrode and a field plate, wherein the gate electrode is arranged adjacent to the body zone and a first section of the drift zone and is insulated from the semiconductor layer by means of a gate dielectric layer, and wherein the field plate is arranged adjacent to a further section of the drift zone and is insulated from the semiconductor layer by a field plate dielectric layer, which is thicker than the gate dielectric layer, wherein
- the field plate has an outer surface arranged at a first height level relative to a reference level in the semiconductor layer,
- a first gate electrode section is has an outer surface arranged at least partially at a second height level, which is closer to the reference level, and
- a second gate electrode section, laterally displaced from the first gate electrode section, having an outer surface extending in the lateral direction that is disposed at a first intermediate level arranged between the first and second height levels relative to the reference level; and wherein the first and the second gate electrode sections are each insulated from the semiconductor layer by the gate dielectric layer that is thinner than the field plate dielectric layer such that the gate dielectric layer has a substantially uniform thickness for both the first and the second gate electrode sections; and wherein the first height level, the second height level and the first intermediate level are defined by that side of the gate dielectric layer facing away from the semiconductor layer.

12. The power transistor as claimed in claim 11, in which the gate electrode has a third gate electrode section, which is arranged adjacent to the body zone and which is arranged at a second intermediate level.

13. The power transistor as claimed in claim 12, in which the second intermediate level corresponds to the first intermediate level.

14. The power transistor as claimed in claim 11, which is realized as a MOSFET and in which the drain zone is of the same conduction type as the drift zone but more heavily doped.

15. The power transistor as claimed in claim 11, which is realized as an IGBT and in which the drain zone is of a complementary conduction type with respect to the drift zone.

16. The power transistor as claimed in claim 11, in which the drift zone is of the first conduction type.

* * * * *